United States Patent [19]

Segal

[11] Patent Number: 4,827,375
[45] Date of Patent: May 2, 1989

[54] MODULAR FRAME ASSEMBLY FOR SOUND SYSTEM COMPONENT

[76] Inventor: Brahm R. Segal, 4265 Carlton Ave., Montreal, Quebec, Canada

[21] Appl. No.: 25,366

[22] Filed: Mar. 13, 1987

[51] Int. Cl.$^4$ ............................................... H05K 7/20
[52] U.S. Cl. ..................................... 361/383; 361/429
[58] Field of Search ............... 361/383, 384, 386-389, 361/394, 395, 399, 422, 424, 428-429; 363/141, 145; 165/80.3

[56] References Cited

U.S. PATENT DOCUMENTS

| | | | |
|---|---|---|---|
| 2,091,549 | 8/1937 | Kelso | 361/390 |
| 2,467,828 | 4/1949 | Hodgkins et al. | 361/428 |
| 2,712,100 | 6/1955 | Brown | 361/429 |
| 3,264,526 | 8/1966 | Wiggerman | 361/395 |
| 3,701,928 | 10/1972 | Davis | 361/383 |
| 4,177,499 | 12/1979 | Volkmann | 361/388 |
| 4,490,596 | 12/1984 | Hirai et al. | 361/384 |

FOREIGN PATENT DOCUMENTS

| | | | |
|---|---|---|---|
| 0245703 | 7/1963 | Australia | 361/429 |
| 0978527 | 12/1964 | United Kingdom | 361/429 |

*Primary Examiner*—A. D. Pellinen
*Assistant Examiner*—Gregory D. Thompson
*Attorney, Agent, or Firm*—Edward A. Sokolski

[57] ABSTRACT

A modular frame assembly for a stereo system component such as an amplifier has a pair of rectangular side panels, a rectangular front panel and a rectangular back panel all removably connected to one another to form a rectangular frame structure. Heavy electrical circuit elements such as transformers and large capacitors are attached to the side panels of the frame assembly, while temperature sensitive circuit elements are mounted to an auxiliary structural member connected to the front and back panels thereof. The auxiliary structural member is aligned with air flow apertures in the front panel and the back panel and preferably consists at least in part of heat conductive material in contact with the temperature sensitive circuit elements. The bottom panel and a top panel of the frame assembly are connected to the rectangular assembly by self locking screws. In a stereo sound system the circuit elements associated with one channel are mounted to the frame assembly in an arrangement mirroring the arrangement on the frame assembly of the circuit elements of the other channel.

5 Claims, 3 Drawing Sheets

MODULAR FRAME ASSEMBLY FOR SOUND SYSTEM COMPONENT

BACKGROUND OF THE INVENTION

This invention relates to a modular frame assembly for supporting and at least in part housing the electrical circuit elements of a sound or stereo system component such as an amplifier.

The various electrical elements of a sound system component such as an amplifier are mounted, either directly or indirectly, on a generally horizontally disposed base. The arrangement of the electrical components on the base, the shape of the housing of the sound system component and the manner in which the housing is attached to the base frequently hinder access to the electrical components for purposes of checking and maintenance.

An object of the present invention is to provide an improved frame or mounting assembly for sound system components such as amplifiers. Another object of the present invention is to provide such frame or mounting assembly in which the electrical circuit components are readily accessible. Yet another object of the present invention is to provide such a frame or mounting assembly in which the various electrical circuit components are disposed in an arrangement which facilitates cooling of temperature sensitive elements.

A further object of the present invention is to provide a frame assembly for mounting the electrical circuit elements of a sound system component in a simple arrangement which facilitates the recognition of the various elements and thereby facilitates checking and maintenance procedures.

Yet a further object of the present invention is to provide such a frame or mounting assembly with improved weight balancing, particularly in sound system components having two sets of substantially identical circuit components associated with respective sound signal channels.

SUMMARY OF THE INVENTION

A modular frame assembly for a sound system component which includes a multiplicity of operatively interconnected co-functioning circuit elements has a first side panel, a second side panel substantially parallel thereto, and a front panel and a back panel attached to the side panels at opposite ends thereof to form a substantially rectangular structure. At least some of the circuit elements of the sound system component are mounted to the side panels of the frame.

The mounting of heavy circuit elements such as large capacitors and transformers directly to the side panels of the frame is particularly advantageous. In the case of a stereo amplifier, the circuit elements for one channel are preferably mounted to one side panel, while the corresponding circuit elements for the other channel are mounted to the other side panel. The mounting of the heavy circuit elements to the side panels of the frame optimizes the weight distribution characteristics of the sound system component.

In a frame or mounting assembly in accordance with the present invention, a top panel and a bottom panel may be removably attached to the rectangular structure at opposite sides thereof. The removal of the top panel and the bottom panel may be facilitated by the use of self locking screws to attach the panels.

In accordance with another feature of the present invention, an auxiliary structural member for carrying at least temperature sensitive circuit elements is disposed in a substantially central location with respect to the rectangular structure of the frame. The front panel and the back panel are each provided with a respective air flow aperture substantially aligned with the auxiliary structural member for enabling the flow of air over the temperature sensitive elements. The auxiliary structural member is advantageously spaced from the heavy circuit elements on the side panels of the frame, especially when these heavy elements are prone to generating substantial amounts of heat. The auxiliary structural elements preferably consists at least in part of a heat conductive material, the heat sensitive elements being disposed in contact with the heat conductive material.

In accordance with a particular feature of the present invention, the auxiliary structural elements is connected at one end to the front panel and at an opposite end to the back panel. With this arrangement, all electrical elements may be mounted to the rectangular structure, the top panel and the bottom panel of the frame assembly both being easily removable for facilitating access to the circuit elements.

In accordance with another particular feature of the present invention, the air intake apertures, whether disposed in the front or the back panel, is covered with a wire mesh material capable of blocking at least forty percent of the dust particles carried by the air. Such a result may be obtained when the wire of the mesh occupies only 15% of the total mesh area.

DETAILED DESCRIPTION

Figure 1:
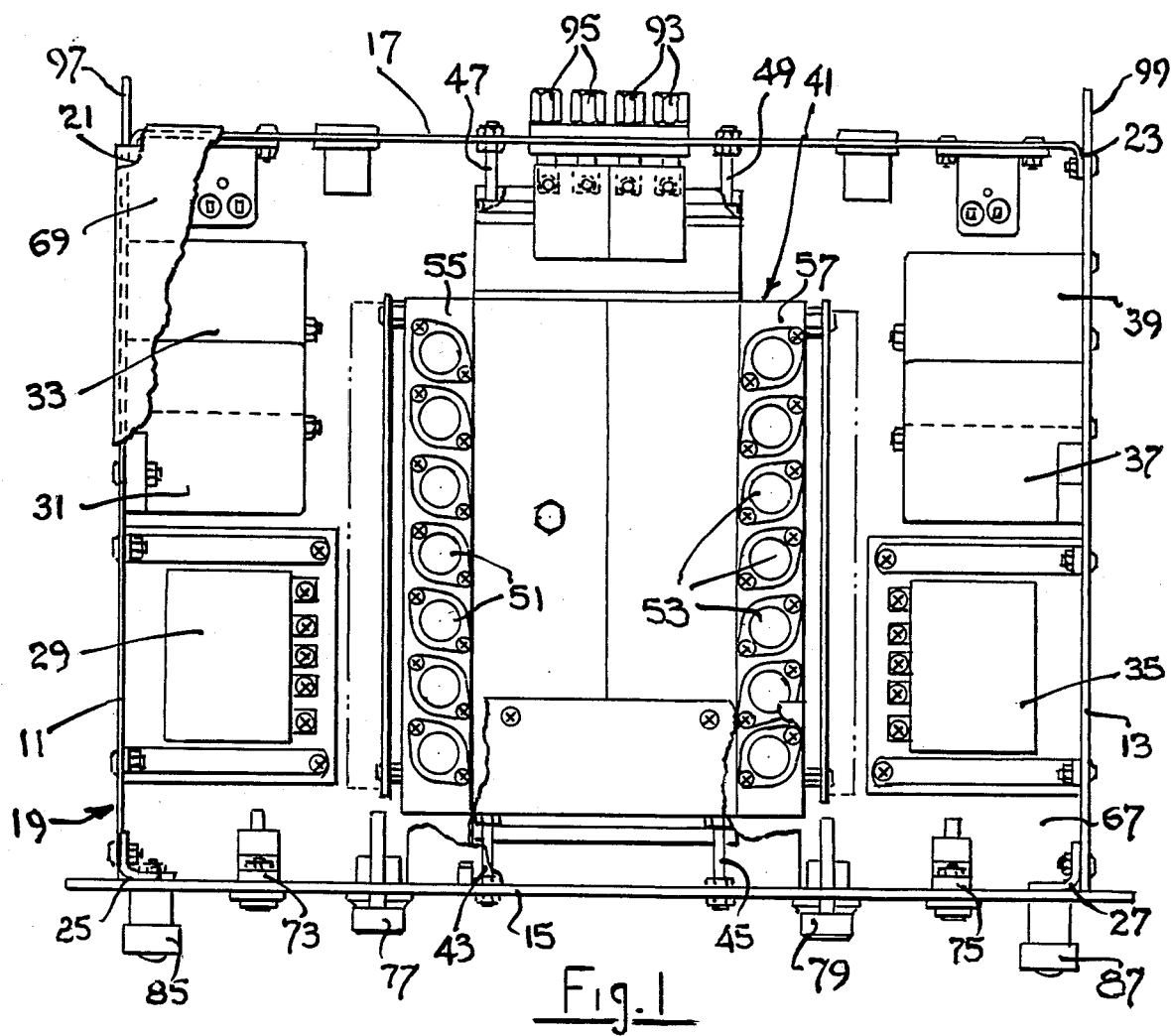
FIG. 1 is a top view, partially broken away, of a modular amplifier frame assembly in accordance with the present invention, showing electrical circuit components in their mounting position on the frame assembly.

As illustrated in FIG. 1, a stereo system component such as an amplifier has a frame assembly comprising a pair of rectangular parallel side panels 11 and 13, a rectangular front panel 15 and a rectangular back panel 17. Front panel 15 and back panel 17 are removably connected to side panels 11 and 13 at opposite ends thereof to form therewith a rectangular support structure 19. Back panel 17 may be provided at opposite ends with a pair of inwardly turned flanges 21 and 23, while the frame assembly further comprises a pair of angle members 25 and 27 engaging front panel 15 and side panels 11 and 13, respectively, in an assembled state of the amplifier frame assembly, flanges 21 and 23 and angles 25 and 27 serving to facilitate the connection of side panels 11 and 13 to front and back panels 15 and 17. The four panels 11, 13, 15 and 17 are secured to each other preferably by means of self locking screws.

In a stereo system component having two sets of substantially identical electrical circuit elements for carrying sound signals of respective channels, heavy circuit elements such as a transformer 29 and a pair of capacitors 31 and 33 of one set of circuit elements are attached to side panel 11 to an inner surface thereof, while the corresponding heavy circuit elements, namely a transformer 35, and another pair of capacitors 37 and 39, of the other set of circuit elements are secured to side panel 13. It is to be noted that the arrangement of circuit elements on side panel 11 is substantially a mirror image of the circuit element array on side panel 13.

An auxiliary support member or bridge 41 is connected to front panel 25 by means of a pair of brackets 43 and 45 and to back panel 17 by means of a similar pair of brackets 47 and 49. A multiplicity of first circuit elements such as transistors 51 associated with the first amplifier channel are mounted to structural member 41 on one side thereof, while a multiplicity of second circuit elements 53 substantially identical to transistors 51 are mounted to member 41 on a side thereof opposite transistors 51. Structural member 41 advantageously consists at least in part of heat conductive metal strips 55 and 57 in heat conductive contact with the casings of circuit elements 51 and 53, respectively, for facilitating the cooling of these circuit elements.

Auxiliary structural member 41 is connected to front panel 15 proximately to a rectangular aperture 61 (see FIG. 3) formed therein and to back panel 17 proximately to an aperture 63 (see FIG. 2) provided therein. Apertures 61 and 63 are aligned with structural member 41 to provide for the flow of a coolant such as air over heat sensitive circuit elements, for example, transistors 51, mounted to structural member 41 and over heat conductive strips 55 and 57. It is to be noted that the lateral sides of structural member 41 are spaced from the heavy circuit elements mounted to side panels 11 and 13.

Figure 2:
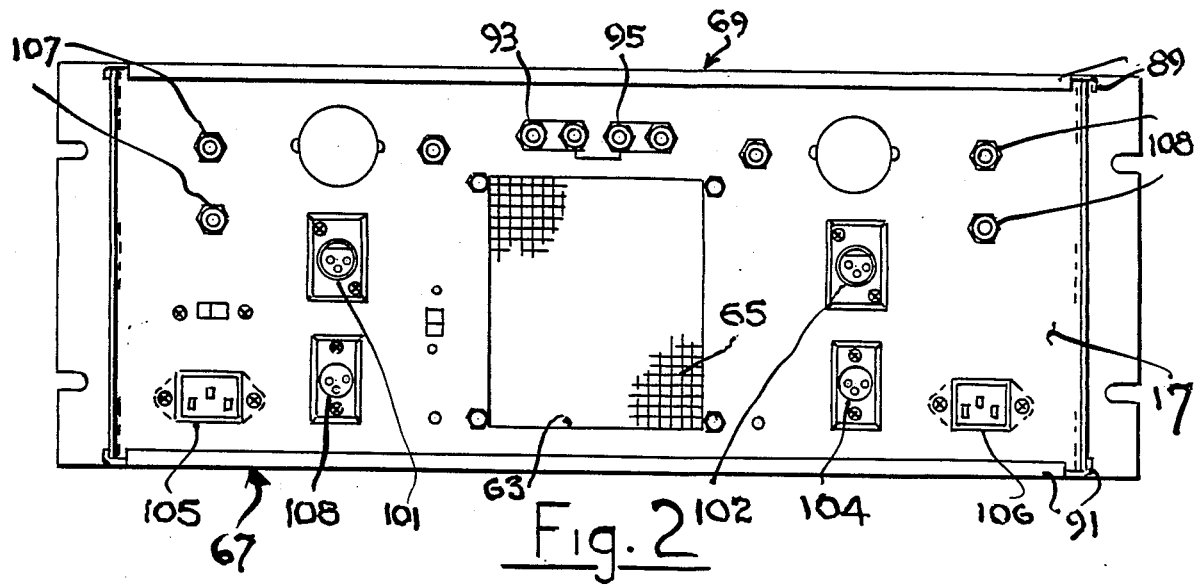
FIG. 2 is a back elevational view of the amplifier frame assembly of FIG. 1.
Figure 3:
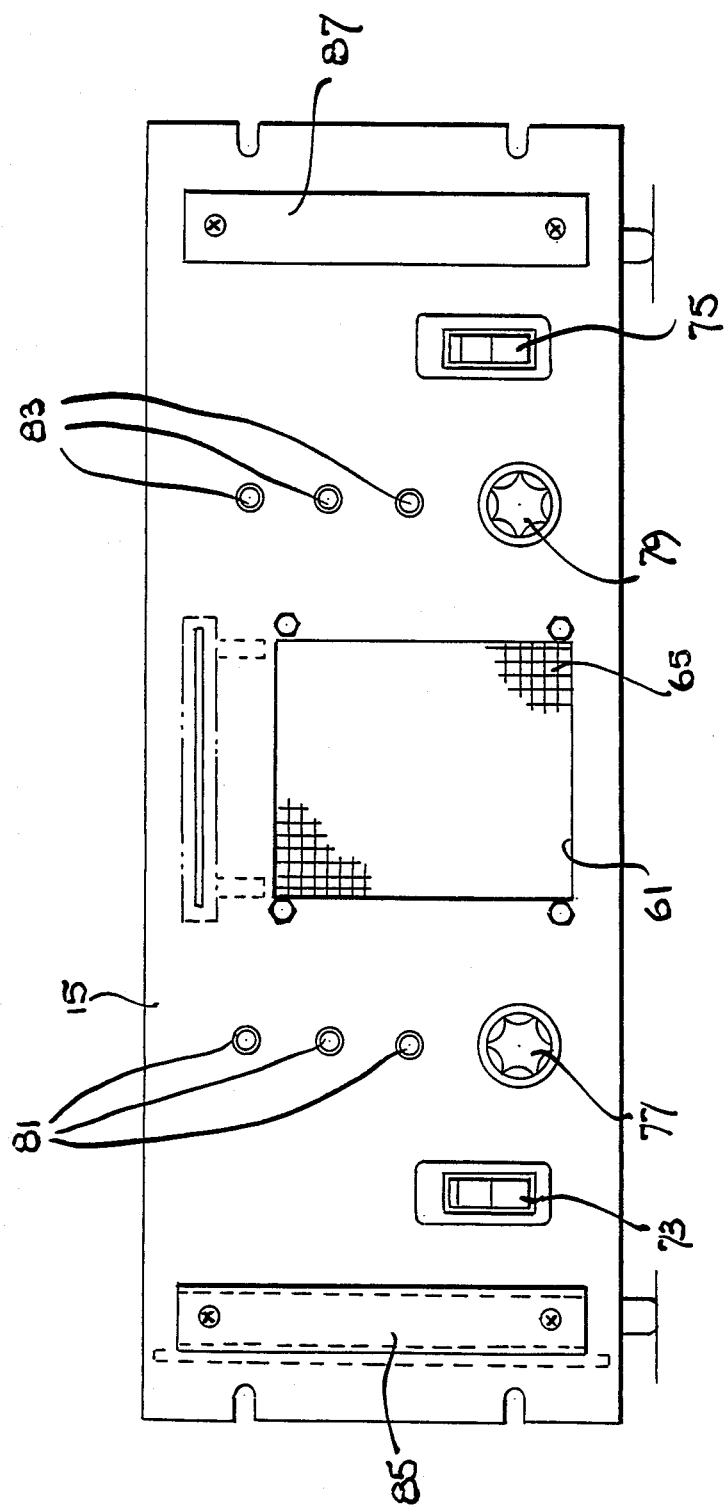
FIG. 3 is a front elevational view of the amplifier frame assembly of FIG. 1.

As illustrated in FIGS. 2 and 3, apertures 61 and 63, particularly the aperture serving as an inflow or suction opening, are advantageously covered with a wire mesh material 65 capable of blocking, e.g., by means of electrostatic induction, at least 40% of the dust particle carried by the ambient air. It has been found that such a high blocking efficiency may be obtained with as little as 15% of the cross-sectional area of the respective apertures being occupied by a solid material.

The amplifier frame assembly of FIGS. 1-4 may include a bottom panel 67 and a top panel 69 removably attached to rectangular structure 19 by means of self locking screws. In the frame assembly of FIGS. 1-4, each electrical circuit element of the sound system component is connected to one of the side panels 11 and 13, the front panel 15 or the back panel 17. Neither the bottom panel 67 nor the top panel 69 serves a support function and both may be easily and quickly removed when access is needed to the operating elements of the stereo system component for checking, repairing or replacing one or more elements. Maintenance operations are further facilitated by the simplified arrangement of the various circuit elements in a mirror-like array.

As illustrated in FIGS. 1 and 3, front panel 15 carries a pair of switches 73 and 75 for turning the power on and off in respective channels of the amplifier. Also mounted on front panel 15 are a pair of rotary knobs 77 and 79 for controlling the volume levels in the respective sound signal channels. A plurality of screw type actuators 81 and 83 accessible through front panel 15 may be provided for setting maximum power limits or thresholds above which the amplifier is automatically disabled or turned off in order to ensure protection of, for example, speaker components connected to outputs of the amplifier or temperature sensitive electrical circuit components within the amplifier. It is to be noted that, for purposes of simplicity, the drawing does not show the electrical wiring extending between the actuators on front panel 15 and other electrical elements of the amplifier circuit.

As illustrated in FIGS. 1 and 3, front panel 15 is provided at opposite ends with a pair of handles or grips 85 and 87 for facilitating the handling of the amplifier component, for example, when the amplifier is mounted in a vertical array or shelf-like arrangement with other sound system components.

As illustrated in FIG. 2, bottom panel 67 and top panel 69 are provided at their edges with respective inwardly turned flanges 89 and 91 which engage the outer surfaces of side panels 11 and 13, front panel 15 and back panel 17 in an assembled state of the amplifier frame assembly.

Figure 4:
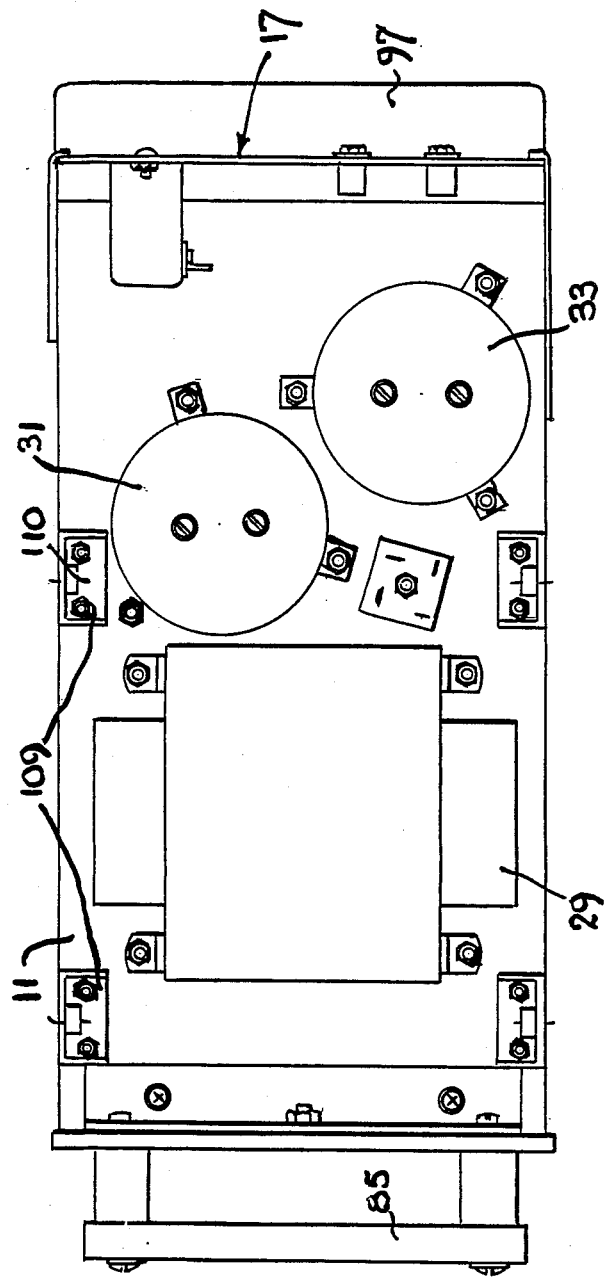
FIG. 4 is a cross-sectional view taken along line 4—4 in FIG. 1.

Back panel 17 is provided with two pairs of output terminals 93 and 95 in the form of socket connectors which project outwardly from the rearward facing surface of back panel 17 (see FIG. 1). As shown in FIGS. 1 and 4, side panels 11 and 13 have rearward portions 97 and 99 projecting beyond the rearward facing surface of back panel 17 by a distance greater than the distance that terminals or connectors 93 and 95 extend beyond panel 17, thereby serving to protect these terminals from damage due to inadvertent knocking of the amplifier frame assembly against other objects.

In addition to terminals 93 and 95, back panel 17 supports a pair of balanced-input sockets 101 and 102, a pair of automatic gain control input sockets 103 and 104, and a pair of power input sockets 105 and 106 for the two channels of the stereo sound system. A plurality of controls 107 and 108 accessible through rear panel 17 may be provided for each stereo system channel for adjusting various parameters of the amplifier circuit. For purposes of simplicity, connections between the operating circuit elements of the amplifier, on the one hand, the various sockets and controls on back panel 17, on the other hand, have been omitted.

As illustrated, in FIG. 4, the side panels, for example side panel 11, may be provided at their upper and lower edges with a plurality of brackets 109 engagable with bottom panel 67 and top panel 69 and securable thereto by means of self locking screws 110.

While certain representative embodiments of the invention have been described herein for purposes of illustration, it will apparent to those skilled in the art that modifications therein may be made without departing from the spirit and scope of the invention.

What is claimed is:

1. In a sound system having two sets of similar circuit components, each of said sets including heavier and lighter circuit elements, a modular frame assembly for supporting and housing said components comprising:

a pair of similar oppositely positioned side panels, the heavier circuit elements of one of said sets of components being mounted on one of said side panels, the heavier circuit elements of the other of said sets of components being mounted to the other of said side panels in a mirror image balanced relationship with the components on said one of said side panels;

a pair of similar oppositely positioned front and rear panels;

an auxiliary bridge support member removably mounted between said front and rear panels in bridging relationship, the lighter circuit elements of one of said circuit components sets being mounted on said auxiliary bridge support member on one side thereof, the lighter circuit elements of the other of said circuit component sets being mounted on said auxiliary bridge support member in opposing mirror image relationship to the lighter circuit elements of said one of said sets;

screened apertures formed in said front and rear panels, said apertures being aligned with said auxiliary bridge support member and with each other to provide an air flow path through said auxiliary bridge support member to cool the components mounted thereon;

top and bottom panels, there being no components mounted on said top and bottom panels; and means for forming a housing from said top, bottom, front, rear, and side panels.

2. The frame assembly of claim 1 wherein, said lighter circuit elements include temperature sensitive elements, said bridge support member being made at least in part of a heat conductive material, said temperature sensitive elements being disposed in contact with said heat conductive material.

3. The frame assembly of claim 2 wherein at least one of said screened apertures is covered with a wire mesh material capable of blocking at least 40% of air-carried dust particles.

4. The frame assembly of claim 1 and further including socket connectors protruding from a rearwardly facing surface of said back panel, and protective means including rearwardly extending projections on said frame assembly for protecting said socket connectors from damage owing to engagement with foreign objects, said projections extending rearwardly beyond said rearwardly facing surface by a distance greater than the length of said socket connectors.

5. The frame assembly of claim 4 wherein said projections consist essentially of rearward portions of said side panels.

* * * * *